United States Patent
Ohshimo et al.

(10) Patent No.: US 7,392,812 B2
(45) Date of Patent: Jul. 1, 2008

(54) SUBSTRATE PROCESSING APPARATUS AND SUBSTRATE TRANSPORTING DEVICE MOUNTED THERETO

(75) Inventors: Tsutomu Ohshimo, Fussa (JP); Akira Fukui, Oume (JP); Junichi Itakura, Kawagoe (JP); Naoki Kyoya, Hachiouji (JP)

(73) Assignee: Kaijo Corporation, Tokyo (JP)

( * ) Notice: Subject to any disclaimer, the term of this patent is extended or adjusted under 35 U.S.C. 154(b) by 621 days.

(21) Appl. No.: 10/688,342

(22) Filed: Oct. 17, 2003

(65) Prior Publication Data

US 2004/0129300 A1 Jul. 8, 2004

(30) Foreign Application Priority Data

Dec. 2, 2002 (JP) ............................. 2002-350316

(51) Int. Cl.
B08B 3/00 (2006.01)
B08B 7/04 (2006.01)

(52) U.S. Cl. ........................ 134/56 R; 134/61; 134/82; 134/902

(58) Field of Classification Search ................. 700/100, 700/103, 117, 121, 28, 95, 900; 134/137, 134/126, 95.1, 902, 82, 133, 56 R, 61; 414/935; 438/5, 907, 908
See application file for complete search history.

(56) References Cited

U.S. PATENT DOCUMENTS 4,892,761 A 1/1990 Yamada
4,966,094 A 10/1990 Yamada
6,161,969 A * 12/2000 Kimura et al. ............... 396/611
6,772,029 B2 * 8/2004 Kobayashi et al. ........... 700/100
2002/0192055 A1 * 12/2002 Kobayachi et al. ........... 414/200

FOREIGN PATENT DOCUMENTS

| JP | 62-078828 | | 4/1987 |
|----|-----------|---|--------|
| JP | 7-22144 | B2 | 3/1995 |
| JP | 10-172939 | A | 6/1998 |
| JP | 2002-172367 | A | 6/2002 |
| WO | WO 0154187 | A1 * | 7/2001 |

* cited by examiner

Primary Examiner—Alexander Markoff
(74) Attorney, Agent, or Firm—Frishauf, Holtz, Goodman & Chick, P.C.

(57) ABSTRACT

The invention provides a substrate processing apparatus including a processing tank for processing substrates, a transporting path provided along the processing tank, a substrate transporting device moving along the transporting path for transporting the substrates, wherein the substrate processing apparatus and the substrate transporting device mounted thereto may realize the improvement of the throughput of substrate processing without increasing the area for installing the substrate processing apparatus. There are provided at least two substrate transporting devices that are capable of moving on the identical transporting path. The movable ranges of the respective substrate transporting devices for transporting the substrates are overlapped with respect to each other. When transportation of the substrates is required simultaneously at a plurality of processing tanks in scheduling data prepared by a scheduler, the scheduling data is determined by referencing substrate transportation sharing conditions.

20 Claims, 11 Drawing Sheets

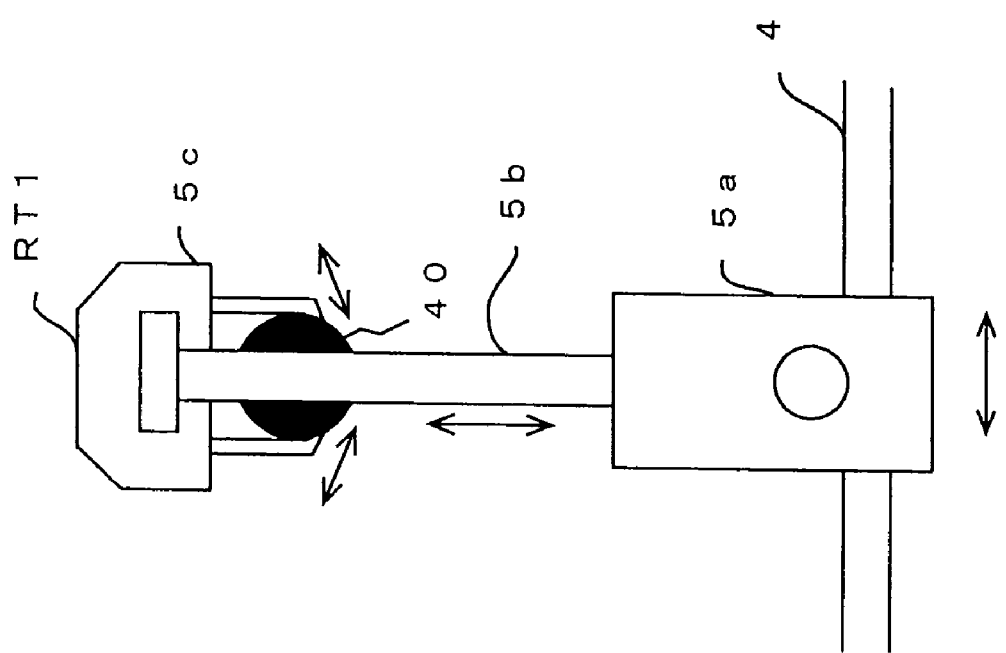

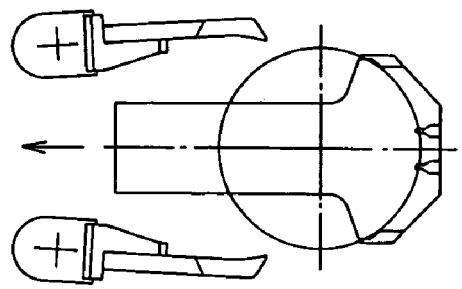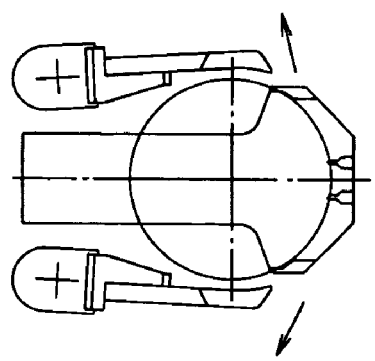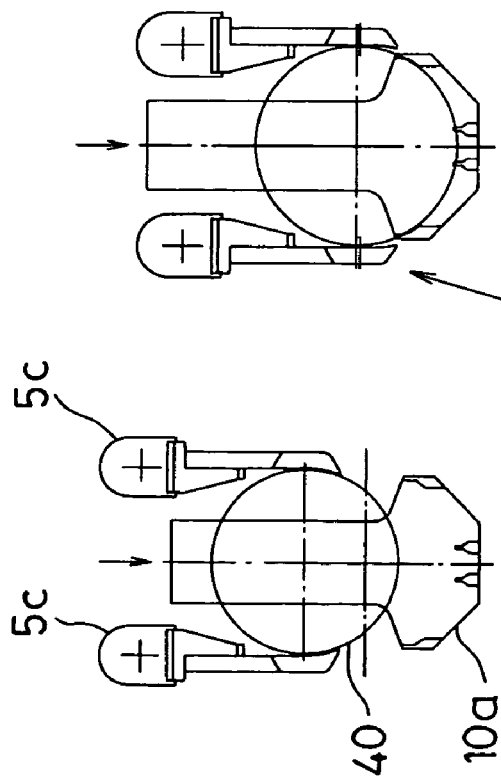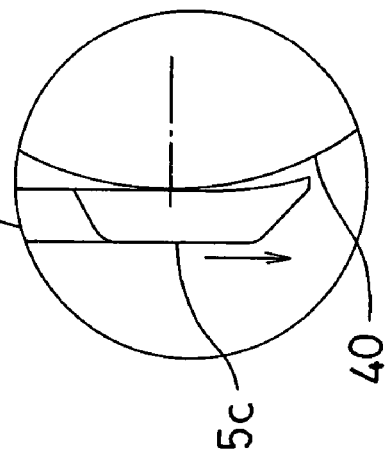
FIG. 7A FIG. 7B FIG. 7C FIG. 7D FIG. 7E

SUBSTRATE PROCESSING APPARATUS AND SUBSTRATE TRANSPORTING DEVICE MOUNTED THERETO

BACKGROUND OF THE INVENTION

1. Field of the Invention

The present invention relates to a substrate processing apparatus for performing processing, such as washing, on substrates, such as silicon wafers, and to a substrate transporting device mounted to the substrate processing apparatus for transporting the substrates, such as silicon wafers, to a processing tank.

2. Description of the Related Art

In a substrate processing apparatus provided with a plurality of processing tanks and drying tanks containing various types of processing solutions (drug solution, rinsing solution) respectively, a substrate, such as a silicon wafer, is soaked into the processing solution in the processing tank by a substrate transporting device according to the processing flow. Provided on the upstream side of the substrate processing apparatus are a stocker for accommodating unprocessed substrates and transporting the same to the delivery position for delivering the same to the substrate transporting device mounted to the substrate processing apparatus and a substrate loading/unloading unit.

The stocker is a device for delivering the unprocessed substrates to the substrate processing apparatus, and transporting the processed substrates, which have passed through the substrate processing apparatus, to a subsequent process. Generally, the unprocessed substrates are delivered from the previous process in lots each including a plurality of substrates disposed in alignment in a cassette. Transporting means includes a cassette transporting system in which the substrates are transported together with the cassette, and so-called a cassette-less system in which only the substrates in the cassettes are held and transported. When constructing the apparatus, either one of these systems is selected as needed.

The substrate loading/unloading unit includes an unprocessed substrate loading unit for holding and taking all the substrates out from the cassette on the stocker delivered in the cassette transporting system and transporting them to the delivery position for delivering the substrates to the substrate transporting device of the substrate processing apparatus and a processed substrate unloading unit for receiving the processed substrates at the delivery position of the substrate transporting device, storing them into the cassette, and delivering them to the stocker.

FIG. 1 is a schematic drawing showing a construction of principal portion of a substrate processing apparatus 50 in the related art. As shown in FIG. 1, the substrate processing apparatus 50 includes a plurality of processing tanks 10-15 containing various types of processing solutions respectively, fastener washing tanks 8 and 9, a drying tank 20, an unprocessed substrate loading unit 35, a processed substrate unloading unit 36, substrate transporting devices R1, R2, and R3 moving along a transporting track 4. FIG. 1 also shows movable ranges of the substrate transporting devices R1, R2, and R3. The substrate transporting devices R1, R2, and R3 are constructed to move on the single track 4. The substrate transporting device R1 holds substrates delivered by the unprocessed substrate loading unit 35 and transports it while soaking it into the processing tanks 10, 11, 12, and 13 in sequence. The delivered substrates are subjected to processing, such as washing, in the processing tanks 10-13. The substrate transporting device R2 transports the substrates having processed in the processing tank 13 and soaks them into the processing tanks 14 and 15 located downstream thereof in sequence. The substrates having processed, for example, washed, in the processing tanks 14 and 15, are transported to the drying tank 20. The substrates having dried in the drying tank 20 are delivered to the processed substrate unloading unit 36 by the substrate transporting device R3. Delivery of the substrates between the substrate transporting devices R1 and R2 is carried out at the processing tank 13, and delivery of the substrates between the substrate transporting devices R2 and R3 is carried out at the drying tank 20. The processing tank at which delivery of the substrates between the substrate transporting devices is performed is referred to as transfer tank. The substrate transporting devices for transporting the substrates to the processing tanks other than the transfer tank are fixed. The substrate transporting devices R1, R2, and R3, shown in FIG. 1, are of cassette-less system.

Preparation of scheduling data for controlling the substrate transporting devices R1, R2, and R3 will now be described. The substrate transporting devices R1, R2, and R3 are controlled according to scheduling data prepared based on the recipe (control program), which includes control parameters such as processing time assigned for each processing tank. FIG. 2 is a flowchart for preparing a control sequence for the substrate processing apparatus by a scheduler in the related art. As shown in FIG. 2, data on the number of processing tanks to be installed, the processing time assigned for each processing tank, the type of processing solution, the movable range of the substrate transporting device, the transporting time, the processing conditions relating operating time of a lifter, and the transporting conditions, is entered through an input device such as a keyboard or by measurement of the transporting time or the operating time of the lifter (teaching) (Step S20). The computer then prepares a processing schedule based on entered data (Step S21). According to the prepared schedule, the computer calculates the time to start loading/unloading the substrates into/out of each processing tank based on data on the processing time and the type of processing solution in each processing tank. The computer also determines whether or not washing of the fastener of the substrate transporting device is necessary depending on the type of processing solution contained in the processing tank. Accordingly, the time to start and time to terminate processing for every processing tank, and the timing of loading and unloading of the substrates for each processing tank of the substrate transporting device are determined.

Then, whether or not the operation of the substrate transporting devices is required simultaneously at a plurality of processing tanks is determined from the timing of loading and unloading into/out of the substrate transporting device (Steps S22 and S23).

When the operation of the substrate transporting device is not required simultaneously at a plurality of processing tanks, the procedure goes to Step S25. When the operation of the substrate transporting device is required simultaneously at a plurality of processing tanks, the procedure goes to Step S24, in which the schedule is changed so that the timing of loading the substrates is delayed (Step S24), and then goes to Step S22. Then, when it is determined that the substrate transporting device can manage processing, the changed schedule is fixed (Step S25). Fixed schedule data is transferred to a control unit of the substrate processing apparatus 1 (Step S26), and then the substrate processing apparatus 1 starts processing (Step S27). With the steps described above, the substrates in the unprocessed substrate loading unit 35 are transported to a first processing tank by a substrate transporting device RT1, and processing of those substrates is started. (See Japanese Examined Patent Application Publication No. 7-22144, Japanese Unexamined Patent Application Publication No. 10-172939, Japanese Unexamined Patent Application Publication No. 2002-172367)

As described above, since the processing time is predetermined by scheduling data for each processing tank, it is necessary to take the substrates out from the processing tank immediately after the processing time assigned for each processing tank has elapsed and to transport it to the next processing tank. However, according to the substrate transporting device in the related art, the movable range of the substrate transporting device across the plurality of tanks is fixed. Therefore, when the substrate transporting device is transporting one lot of substrates in the movable range, and if transportation of another lot of substrates in another processing tank is required in the movable range, the substrate transporting device in operation cannot access to another processing tank. Therefore, another lot of substrates in another processing tank has to wait until the current operation of the substrate transporting device is terminated.

FIG. 3 is a timing chart showing processing of substrates in each processing tank in chronological order. Arrows shown in FIG. 3 represent the substrate transporting operations to be performed by the substrate transporting device, and hutched bars represent that processing is in progress in the processing tank, and the length of the hutched bar represents the processing time.

As shown in FIG. 3, when groups of substrates (a first lot, a second lot, and a third lot shown by circles) shown in FIG. 3 are loaded in sequence starting from the first processing tank 10 from the unprocessed substrate loading unit 35, since the processing time is limited for each processing tank, two processing tanks require transportation of the substrates simultaneously at the timings t1 and t2, as shown in FIG. 3, namely, when transferred from the processing tank 10 to the processing tank 11, and from the processing tank 12 to the processing tank 13. Since only one substrate transporting device is available in the range from the processing tank 10 to the processing tank 13, one processing tank has to wait until transportation at another processing tank is terminated.

In order to solve such a problem, it is necessary to delay loading of the substrates into the first processing tank so that completion of processing of the substrates does not occur at a plurality of tanks simultaneously. In the conventional system, as shown in FIG. 4, loading of the groups of substrates (first lot, second lot) into the first processing tank is delayed, so that completion of processing of the substrates does not occur at a plurality of tanks simultaneously.

However, by delaying loading of the substrates into the processing tank, a throughput of the substrate in the substrate processing apparatus 50 is restrained, and thus the number of substrates that can be processed during a predetermined time period is reduced. Therefore, improvement of the throughput of substrate processing in the substrate processing apparatus 50 is a subject to be achieved.

SUMMARY OF THE INVENTION

Accordingly, it is an object of the invention to provide a substrate processing apparatus and a substrate transporting device mounted thereto, in which improvement of the throughput of substrate processing is achieved by overlapping movable ranges of a plurality of substrate transporting devices for transporting substrates across a plurality of tanks with respect to each other and enabling the plurality of substrate transporting devices to be operated simultaneously within the respective movable ranges without increasing the area for installation.

According to the invention, there is provided a substrate processing apparatus including processing tanks for processing substrates, a transporting track provided along the processing tanks, and substrate transporting devices moving along the transporting track for receiving, delivering and transporting the substrates, wherein at least two such substrate transporting devices are provided on the identical transporting track, and the substrate transporting devices are operable in common operating ranges across a plurality of processing tanks.

According to the invention, there is provided a substrate processing apparatus including processing tanks for processing substrates, a transporting track provided along the processing tanks, and substrate transporting devices moving along the transporting track for receiving, delivering and transporting the substrates, wherein a shuttle for transporting unprocessed substrates is provided at a level higher than the substrate transporting devices in parallel with the transporting track.

According to the invention, there is provided a substrate processing apparatus including processing tanks for processing substrates, a transporting track provided along the processing tanks, and substrate transporting devices moving along the transporting track for receiving, delivering and transporting the substrates, wherein at least two such substrate transporting devices are provided on the identical transporting track, the substrate transporting devices are operable in common operating ranges across a plurality of processing tanks, and a shuttle for transporting unprocessed substrates are provided at the level higher than the substrate transporting devices in parallel with the transporting track.

The substrate processing apparatus according to the invention further includes a specific tank as fastener washing means for washing substrate fasteners of the substrate transporting device for each of the substrate transporting devices.

The substrate processing apparatus according to the invention further includes a substrate lowering unit for receiving the unprocessed substrates from the shuttle and sending the unprocessed substrates down to the delivery position of the substrate transporting device.

The substrate processing apparatus according to the invention further includes a substrate hoisting unit for hoisting and transporting the unprocessed substrate to the shuttle.

The substrate processing apparatus according to the invention preferably includes a unit for loading of unprocessed substrate for transporting the unprocessed substrates from a position for loading the unprocessed substrates to the substrate hoisting unit.

The substrate processing apparatus according to the invention preferably includes a unit for unloading of a processed substrate for receiving the processed substrates from the substrate transporting device and transporting them to the position for unloading the substrates.

According to the invention, there is provided a substrate transporting device in the substrate processing apparatus for controlling the substrate transporting device based on scheduling data prepared by the scheduler based on processing conditions and transporting conditions, which are entered in advance, wherein in the case in which transportation of the substrates occurs at the plurality of processing tanks simultaneously according to the scheduling data prepared by the scheduler, scheduling data is determined by referencing substrate transportation sharing conditions.

The scheduler of the substrate transporting device in the substrate processing apparatus according to the invention preferably selects a substrate transporting device which performs transporting operation for loading and unloading the substrates into/from the predetermined processing tank among the plurality of substrate transporting devices in the common operating region.

As described thus far, the substrate processing apparatus and the substrate transporting device mounted thereto according to the invention is capable of transporting the substrates in the plurality of processing tanks simultaneously by providing a plurality of the substrate transporting devices on the identical transporting track and controlling them to be able to move along the plurality of tanks in the respective movable range which are overlapped with respect to each other. Accordingly, improvement of the throughput of substrate processing in the substrate transporting device 50 is achieved.

In addition, according to the substrate processing apparatus of the invention, since the shuttle for supplying specifically the unprocessed substrate is provided without increasing the area for installation, the substrates can be supplied to a buffer independent from the operation of the substrate transporting device, and thus improvement of throughput of the substrate processing is achieved.

BRIEF DESCRIPTION OF THE DRAWINGS

FIG. 6 is a drawing showing a construction and an operation of a substrate transporting device in the substrate processing apparatus according to the invention;

FIGS. 7A to FIG. 7E are drawings showing delivery of the substrates into a processing tank of the substrate transporting device;

DESCRIPTION OF THE PREFERRED EMBODIMENTS

Figure 1:
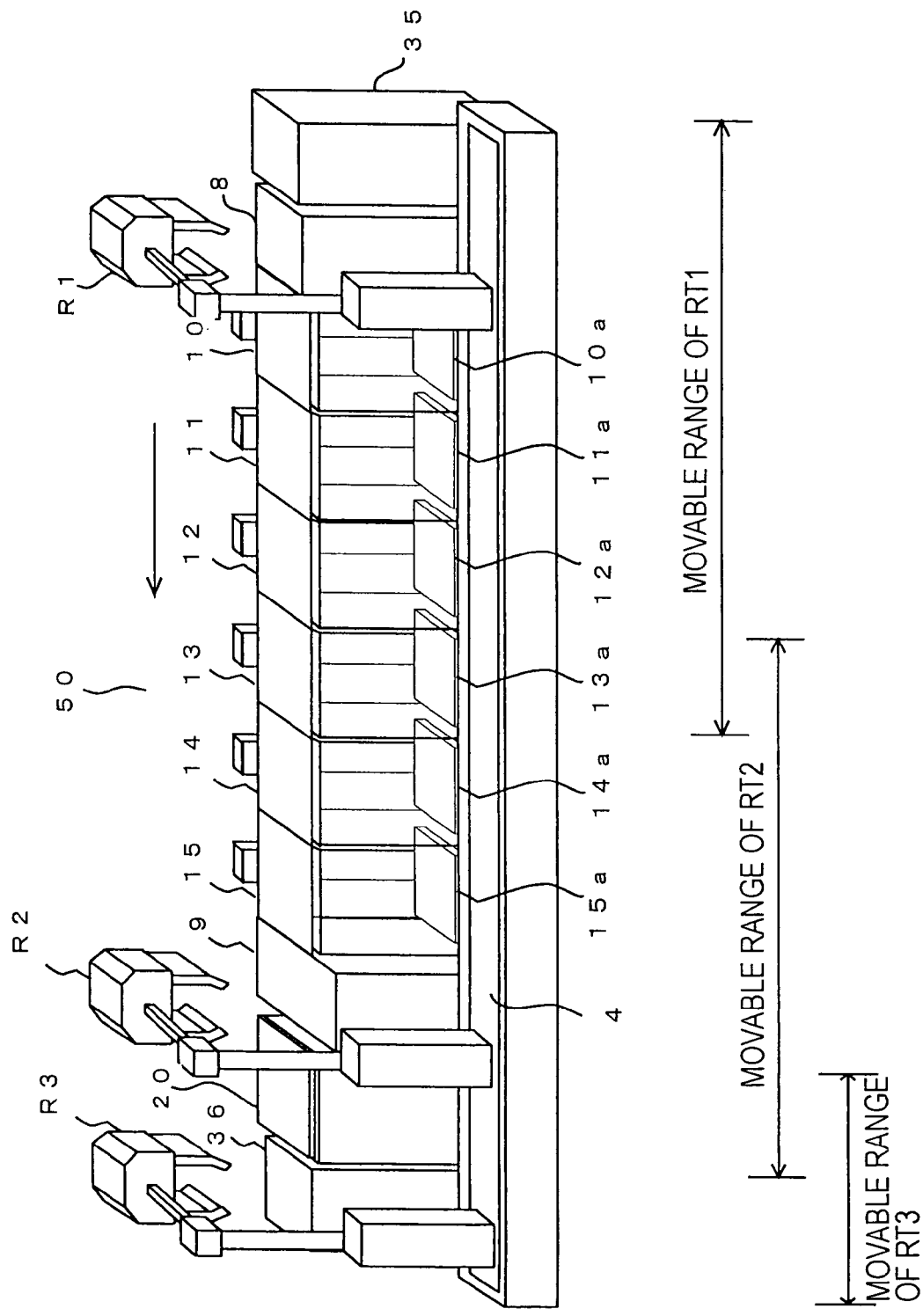
FIG. 1 is a schematic drawing showing a construction of principal portion of a substrate processing apparatus in the related art.
Figure 2:
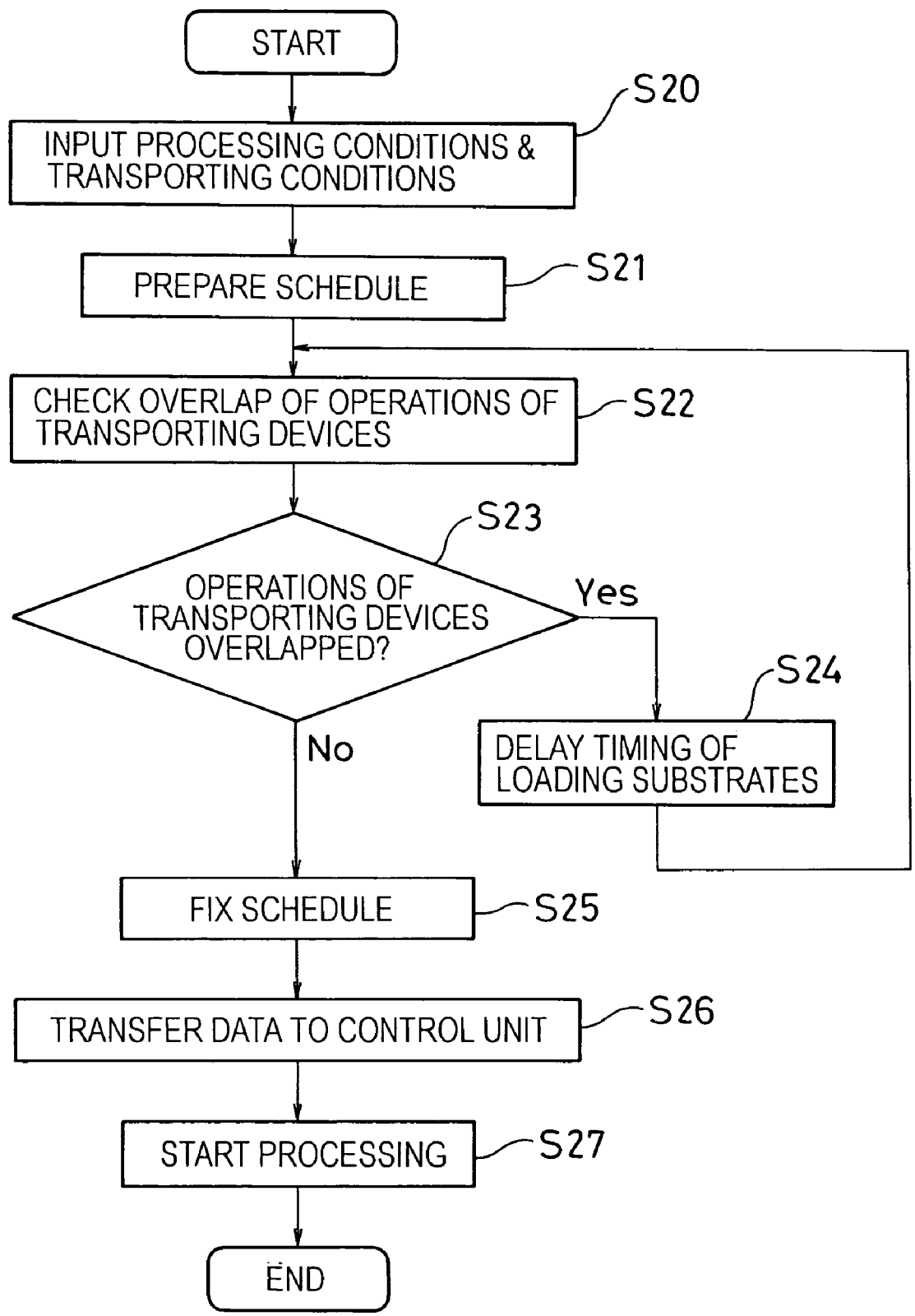
FIG. 2 is a flowchart for preparing a control sequence for the substrate processing apparatus by a scheduler in the related art.
Figure 3:
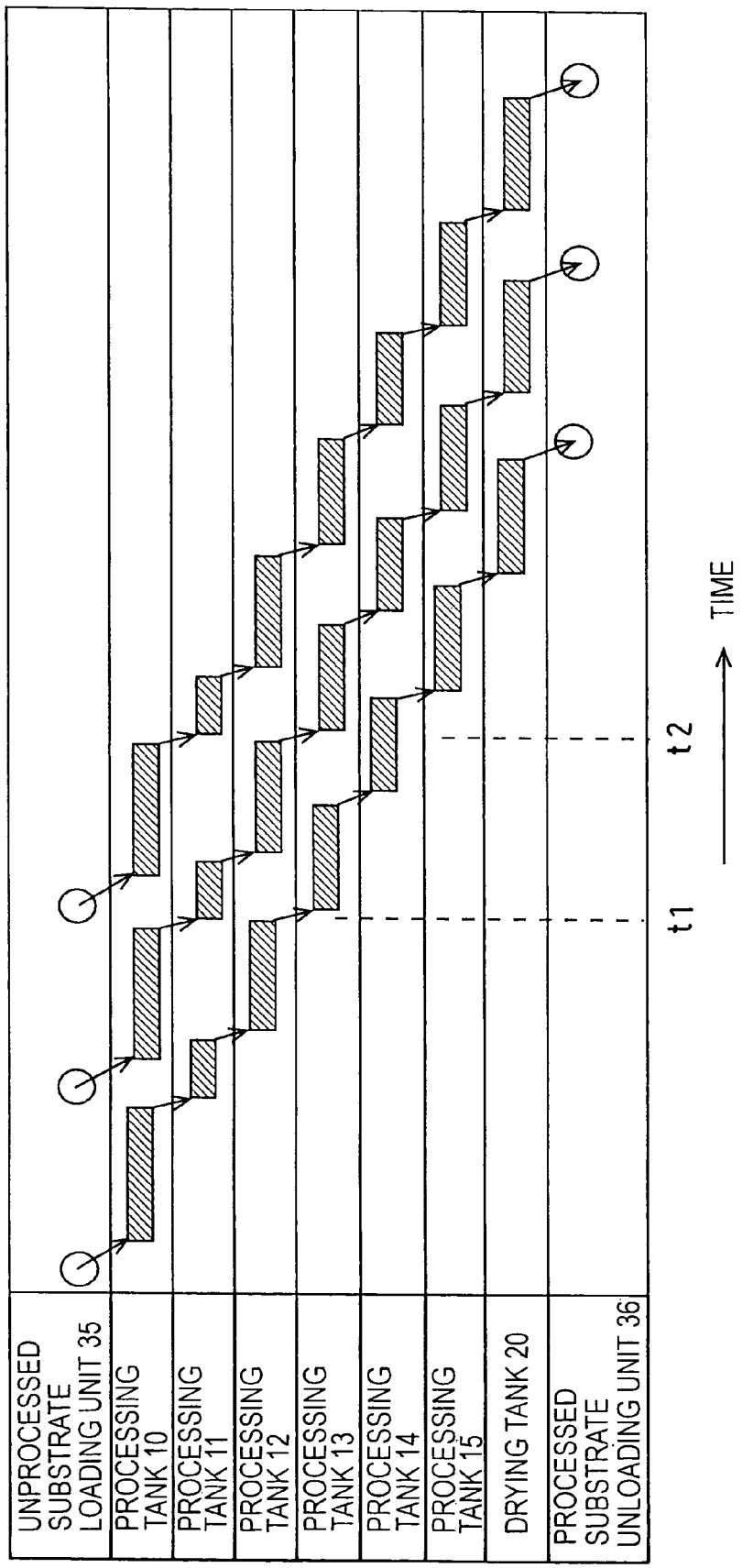
FIG. 3 is a timing chart showing processing of substrates in each processing tank in chronological order.
Figure 4:
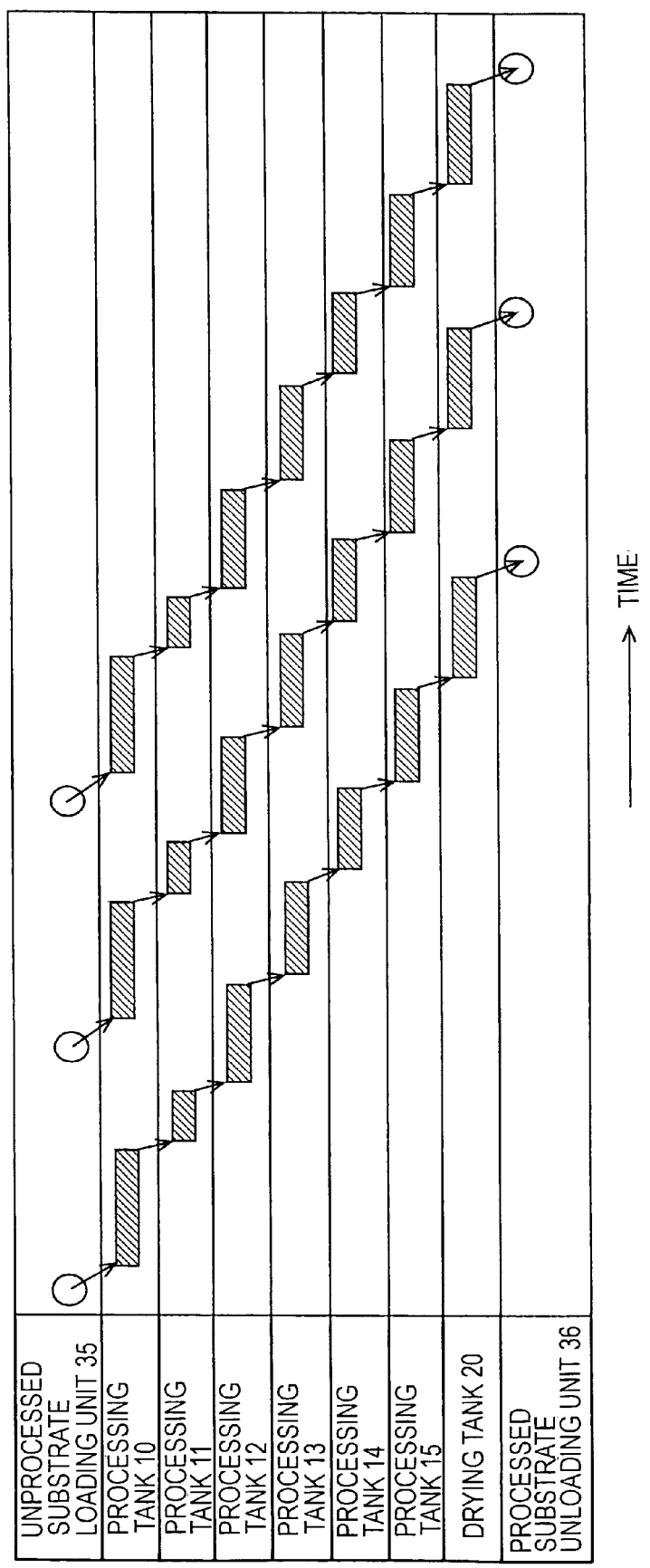
FIG. 4 is a timing chart showing a case in which loading of the substrates into a first processing tank is delayed to avoid simultaneous occurrence of completion of processing at a plurality of tanks.
Figure 5:
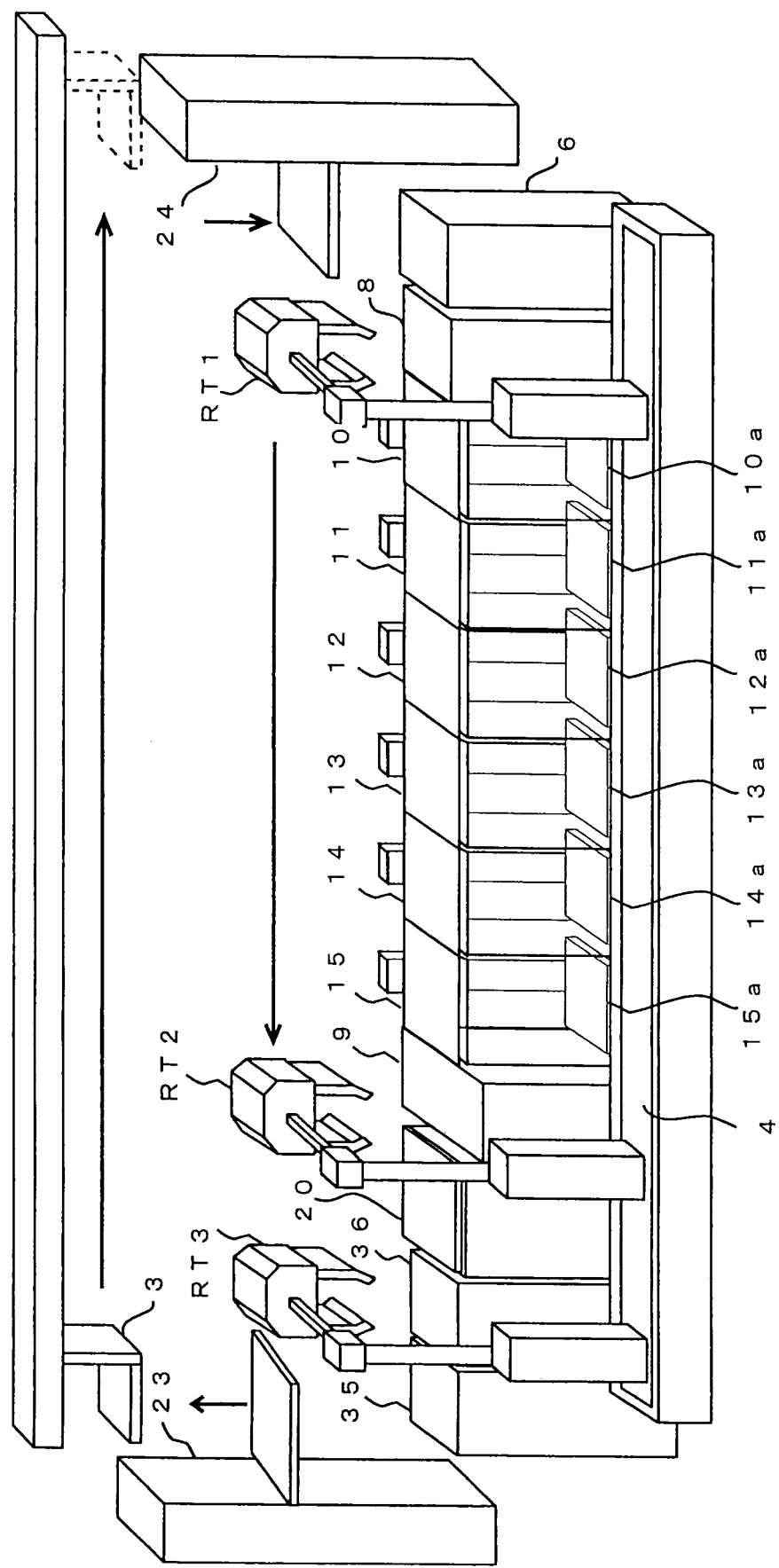
FIG. 5 is a drawing showing a construction of a substrate processing apparatus according to the invention.
Figure 8:
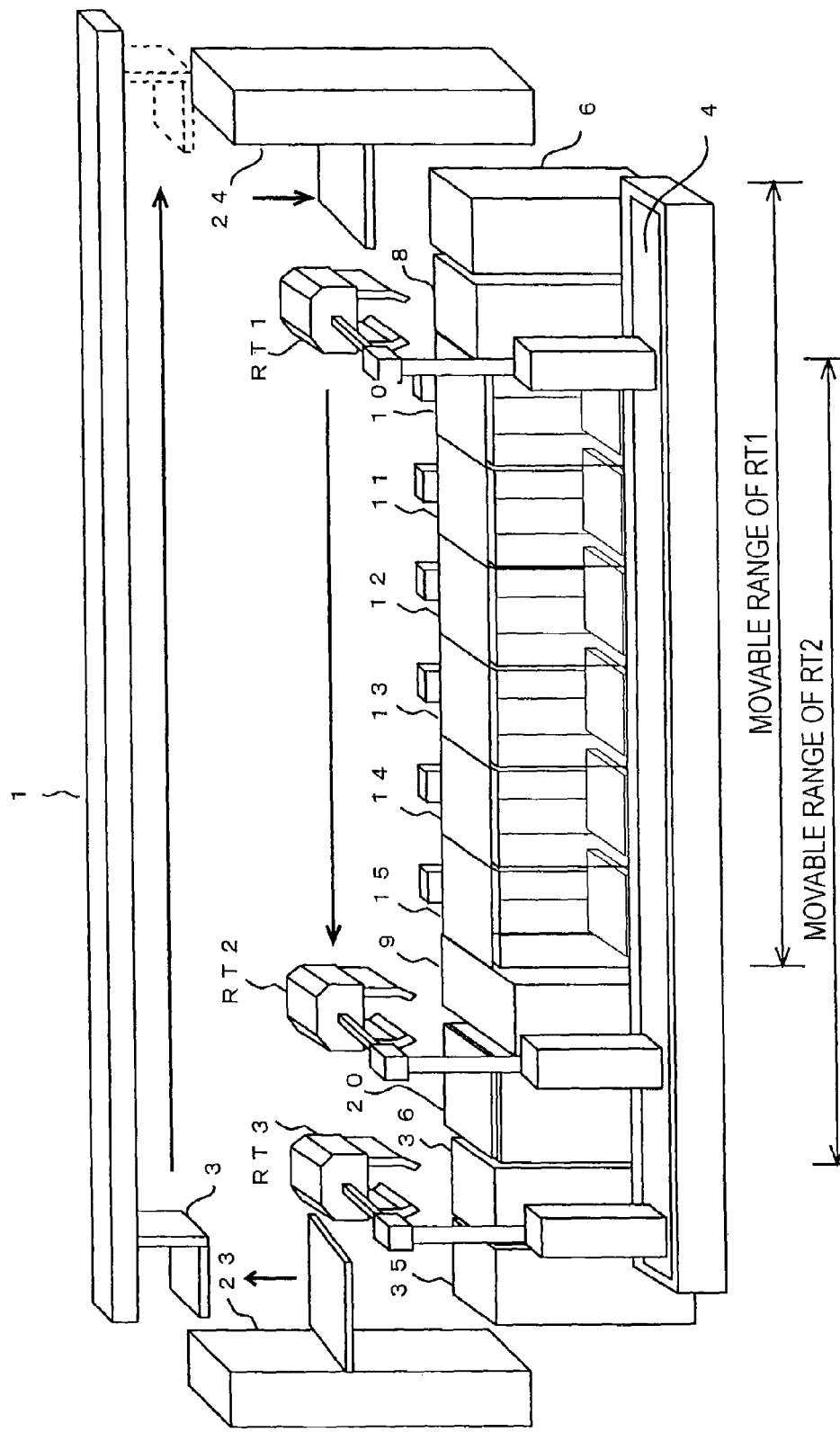
FIG. 8 is a drawing showing the movable region of the substrate transporting devices in the substrate processing apparatus on a transporting track.
Figure 9:
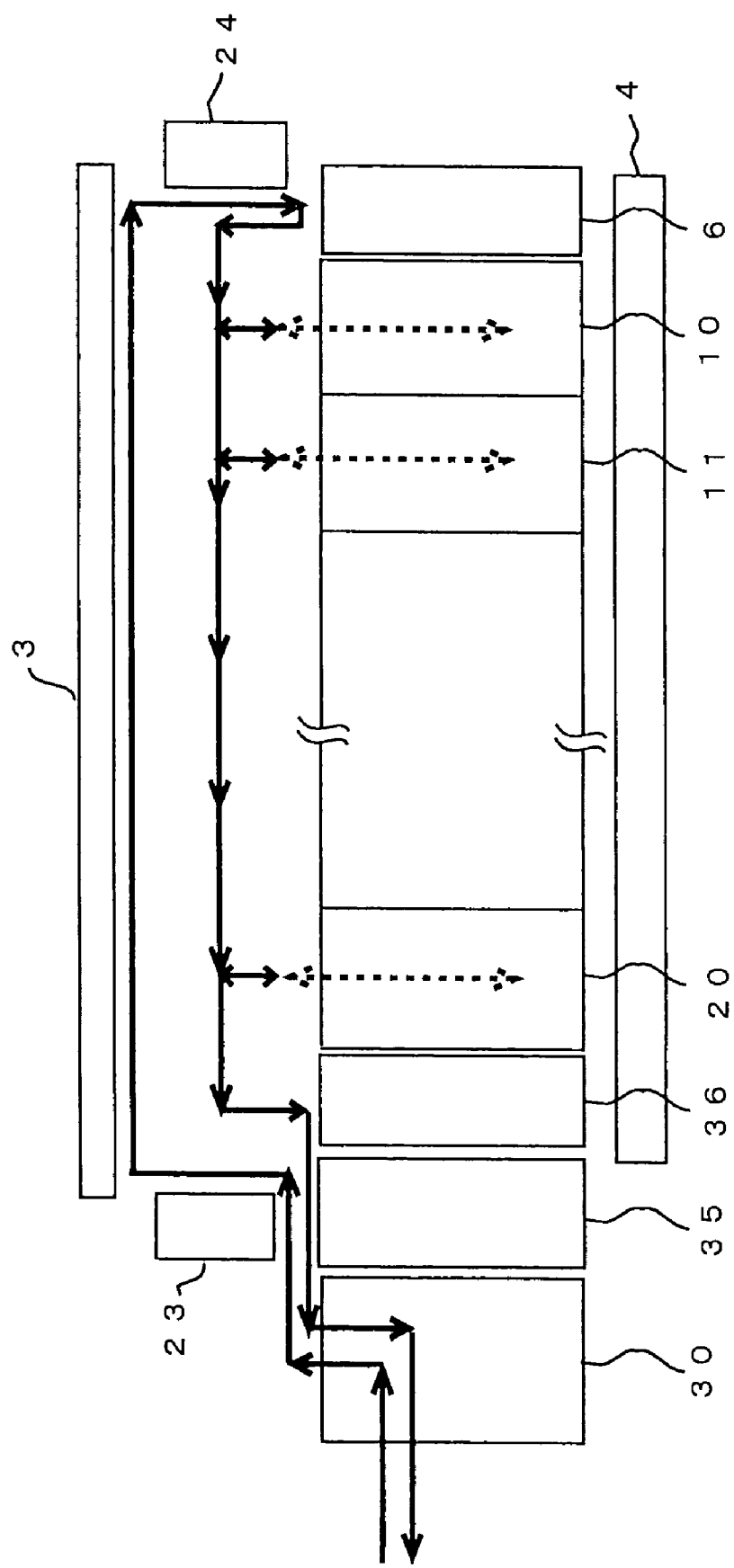
FIG. 9 is a drawing showing a transporting path of the substrate including a stocker, a substrate loading/unloading unit, and the substrate processing device viewed from the front.

Referring now to the drawings, an embodiment of a substrate processing apparatus and a substrate transporting device mounted thereto according to the invention will be described. FIG. 5 is a drawing showing a construction of the substrate processing apparatus according to the invention; FIG. 6 is a drawing showing a construction and operation of the substrate transporting device mounted thereto according to the invention; FIG. 7 shows delivery of the substrates into a processing tank of the substrate transporting device; FIG. 8 is a drawing showing the movable region of the substrate transporting devices in the substrate processing apparatus on a transporting track; and FIG. 9 is a drawing showing a transporting path of the substrate including a stocker, a substrate loading/unloading unit, and the substrate processing device viewed from the front. The portions having the same construction and function as the substrate processing apparatus in the related art shown in FIG. 1 are designated by the same reference numbers in the description.

As shown in FIG. 5, a substrate processing apparatus 1 according to the invention includes processing tanks 10-15, fastener washing tanks 8 and 9, a drying tank 20, a buffer 6, an unprocessed substrate loading unit 35, a processed substrate unloading unit 36, substrate transporting devices RT1, RT2, and RT3 moving on a transporting track 4, a substrate hoisting unit 23, a substrate lowering unit 24, and a shuttle 3. The substrate processing apparatus 1 is used in combination with the unprocessed substrate loading unit 35 and the substrate hoisting unit 23, which receive the unprocessed substrates supplied by a stocker 30 (shown in FIG. 9) and transport them to the position for delivering them to the shuttle 3.

The stocker 30 is a device for loading the unprocessed substrates, such as silicone wafers, to the substrate processing apparatus 1 and transporting the processed substrates, which has passed through the substrate processing apparatus 1, to the subsequent processes.

The unprocessed substrate loading unit 35 which serves as substrate loading unit takes all the substrates from the cassette in the stocker 30 by fastening altogether and transfers them to the delivery position of the substrate hoisting unit 23.

The processed substrate unloading unit 36 which serves as substrate unloading unit receives the processed substrates transported by the substrate transporting device RT3, stores them in a cassette, and delivers to the stocker 30.

As shown in FIG. 5, the buffer 6 is a device for temporarily accommodating the plurality of substrates transported from the shuttle 3, and moving the substrates to the position for delivering them to the substrate transporting device RT1.

As shown in FIG. 5, the processing tanks 10-15 are devices to be used for processing, such as washing, and containing processing solutions respectively, in which the substrates are soaked. The processing tanks 10-15 are disposed in line along the transporting track 4 in the order of processing of the substrates. The substrates transported by the substrate transporting devices RT1 and RT2 are loaded into the processing tanks and unloaded from the processing tanks of the substrate after having processed by lifters provided in the processing tanks respectively.

Tables 10a-15a (shown in FIG. 5) of the lifters in the processing tanks 10-15 are devices for receiving the substrates from the substrate transporting device at the delivery position, soaking them into the processing tanks 10-15, and lifting the processed substrates to the delivery position for delivering them to the substrate transporting devices.

The lifter is provided with an elevating unit which is movable in the vertical direction. The elevating unit has a substrate holding potion for holding the substrates, so that the substrates received by the substrate transporting devices RT1 and RT2 are held by the tables 10a-15a. Materials of the tables 10a-15a for holding the substrates may be selected depending on the type of processing solution in the processing tanks. Fluorine contained resin such as Teflon® or thermoplastic resin such as PVC, PVDF are normally selected for the processing tanks that accommodate a processing solution at a temperatures lower than 100° C., and quartz or a material which is formed by applying fluorine contained resin on the surface of quartz is used for the processing tanks that accommodate a processing solution at a temperature higher than 100° C.

As shown in FIG. 5, the fastener washing tanks 8 and 9, which correspond to fastener washing means, are devices for washing extremities of a substrate fasteners 5c of the substrate transporting devices (shown in FIG. 6), on which the processing solution is attached, in order to remove the attached processing solution before proceeding to the fastening operation for the next lot of substrates. The fasteners are lowered into the fastener washing tanks (a pure overflow tank provided with a rapid discharging function) 8 and 9 and soaked therein, where the processing solution attached on the fastener is washed by pure displacement, and then lifted up at a velocity of 1-20 mm/sec for removing pure water attached on the surfaces of the fasteners. The substrate transporting devices RT1 and RT2 are absolutely required to be washed at their substrate fasteners in the fastener washing tanks 8 and 9 each time after they have unloaded the substrates from the processing tank which contains the processing solution. The fastener washing tank is provided for each substrate transporting device. The substrate transporting device RT1 uses the fastener washing tank 8, and the substrate transporting devices RT2 and RT3 use the fastener washing tank 9. Washing of the substrate fasteners is not required after the transportation of the substrates from the processing tanks for overflow rinsing or quick damp rinsing, which do not use the processing solution.

The substrate transporting devices RT1, RT2, and RT3 are disposed on the identical transporting track 4 and are operated as follows. The substrates in the buffer 6 transported by the shuttle 3 are held and moved along the transporting track 4 which is provided along the processing tank, and transported to the substrate delivery position of the processing tank. Then, the substrates which has processed in the processing tanks are held at the substrate delivery position and transported to the next processing tank. The substrates which are dried in a drying tank are then transported to the processed substrate unloading unit 36. An arrow shown in FIG. 5 represents a route along which the substrates are transported.

As shown in FIG. 6, the substrate transporting devices RT1, RT2, RT3 each include a laterally movable portion 5a movable freely along the transporting track 4, a vertically movable portion 5b movable in the vertical direction, and the substrate fastener 5c for fastening, holding, and releasing a substrate 40.

The laterally movable portion 5a of the substrate transporting device is movable on a rack which corresponds to the transporting track 4 by a pinion driven by a pulse motor or the like. The substrate transporting device may be moved to a predetermined position by applying the number of pulses and the direction of movement which corresponds to the amount of movement to the pulse motor via a pulse motor driver.

The vertically movable portion 5b of the substrate transporting device moves upward and downward by rotating a ball screw by the pulse motor or the like. The substrate fastener 5c mounted at the extremity of the vertically movable portion 5b to the top dead center and the bottom dead center (substrate delivery positions) can be moved by applying the number of pulses and the vertical direction as the amount of vertical movement to the pulse motor via the pulse motor driver. The substrate fastener 5c for fastening, holding, and releasing the substrates 40 is capable of fastening, holding, and releasing the substrates 40 by moving the extremities thereof in the direction shown in FIG. 6 by the motor. The substrate fastener 5c is provided with a substrate sensor (a substrate presence detecting sensor) for detecting failure of fastening or failure of releasing of the substrate 40. The extremities of the substrate fastener 5c is constructed of Teflon® which is a material with less hard than material of the substrates to be processed.

FIGS. 7A to 7E show the delivery operation for delivering the substrates to the processing tank of the substrate transporting device. As shown in FIG. 7A, the substrate fastener 5c of the substrate transporting device moves downward until the position just before the table 10a of the processing tank in a state of holding the substrate 40. Subsequently, the substrate transporting device moves downward at a slow speed. When the substrates come into contact with the table 10a as shown in FIG. 7B, the downward movement of the substrate fastener 5c stops. The state in which the substrate fastener 5c holds the substrates 40 at this moment is shown in FIG. 7E in an enlarged manner. As shown in FIG. 7E, even when the substrate fastener 5c is moved further downward after the substrates comes into contact with the table 10a, since the substrates 40 are not constrained in the upward direction by the substrate fastener 5c, the substrates slide upward along the substrate fastener 5c. Therefore, the substrates are prevented from becoming damaged. After placing the substrates on the table 10a, as shown in FIG. 7C, the substrate fastener 5c is rotated in the directions indicated by arrows, and release the substrates from being held. Then, as shown in FIG. 7D, the substrate fastener 5c is moved upward.

The transporting track 4 shown in FIG. 5 is provided along the processing tanks 10-15, so that the substrate transporting devices can move freely along the transporting track 4. The transporting track 4 is provided with the rack, so that the substrate transporting devices RT1, RT2, and RT3 can move freely along the transporting track 4 by the pinion of the laterally movable portion 5a of the substrate transporting device.

The shuttle 3 shown in FIG. 5 is a device for receiving the unprocessed substrates, which are stored in the cassette transported from the stocker 30 and taken from the cassette by the unprocessed substrate loading unit 35 by being fastened altogether, from the substrate hoisting unit 23 and transporting them to the substrate lowering unit 24. As shown in FIG. 5, the shuttle 3 is disposed in parallel with the transporting track 4 at the position higher than the substrate transporting devices RT1, RT2, and RT3, so as to be capable of transporting the substrates to the substrate lowering unit 24. The shuttle 3 can be operated independently of the transporting track 4. Therefore, the unprocessed substrate from the stocker can be transported to the first processing tank, and thus the substrate transporting devices RT1, RT2, and RT3 can work only for transporting the substrates between the processing tanks.

The operation of the substrate transporting device in the substrate processing apparatus 1 will now be described. FIG. 8 is a drawing showing a movable range of the substrate transporting devices RT1, RT2, and RT3 of the substrate processing apparatus 1 on the transporting track 4. As shown in FIG. 8, the substrate transporting device RT1 is capable of moving form the buffer 6 to the last processing tank 15. The substrate transporting device RT2 is capable of moving from the first processing tank 10 to the drying tank 20. The substrate transporting device RT3 is capable of moving from the fastener washing tank 9 to the processed substrate unloading unit 36. The substrate transporting device RT1 and the substrate transporting device RT2 can commonly be moved from the first processing tank 10 to the last processing tank 15. However, since the transporting track 4 is shared, the substrate transporting device RT1 is capable of moving to the $n-1^{th}$ processing tank, which is immediately before the processing tank at which the substrate transporting device RT2 is currently located (the position where the n$^{th}$ processing tank is located).

Provided between the buffer 6 and the first processing tank 10 is the first fastener washing tank 8. The first fastener washing tank 8 is a fastener washing tank specifically provided for washing the substrate fastener 5c of the substrate transporting device RT1.

Provided between the last processing tank 15 and the drying tank 20 is the second fastener washing tank 9. The second fastener washing tank 9 is a fastener washing tank specifically provided for washing the substrate fastener 5c of the substrate transporting device RT2 and the substrate transporting device RT3.

Normally, the substrate transporting device RT1 waits on the first fastener washing tank 8, the substrate transporting device RT2 waits on the second fastener washing tank 9, and the substrate transporting device RT3 waits on the processed substrate unloading unit 36.

Accordingly, when one of these three substrate transporting devices RT1, RT2, and RT3 is operated, for example, when only the substrate transporting device RT2 is operated, and the remaining two substrate transporting devices RT1 and RT3 are waiting, the substrate transporting device R2 can move within the region from the first processing tank 10 to the drying tank 20. When the substrate transporting devices RT1 and RT2 are operated simultaneously, the substrate transporting device RT1 can move to the position immediately before the substrate transporting device RT2.

Subsequently, loading of the substrates to the processing tank, unloading of the substrates from the processing tank, and movement among the processing tanks of the substrate transporting devices will be described.

When loading the substrate into the processing tank by the substrate transporting device RT1, the substrates are held by the substrate fastener 5c, and then the substrate fastener 5c is lifted to the top dead center after the substrates are fastened. When they reached the top dead center, they are moved along the transporting track 4 and stops exactly above the processing tank. The processing tank opens its lid located on top thereof, and moves the lifter upward to the substrate delivery position. The substrate transporting device RT1 moves the substrate fastener 5c downward to the position immediately before the substrate delivery position of the lifter. Then, the substrate fastener 5c is moved additionally 2-5 mm downward from the substrate delivery position of the lifter, places the substrates on the lifter in a state of fastening the substrates, and stops. At this time, the substrates are held by both of the substrate fastener 5c and the lifter. After the substrate fastener has stopped, the extremities of the substrate fastener 5c are opened, and deliver the substrates to the lifter completely. The substrate transporting device RT1 moves the substrate fastener 5c upward to the top dead center. After the extremities of the substrate fastener 5c is opened, the fact that the substrates to be processed are placed on the lifter is checked by the substrate presence detecting sensor provided on the lifter, and upward movement of the substrate transporting device RT1 and downward movement of the lifter are performed simultaneously. After termination of the upward movement of the substrate transporting device RT1, the fact that no substrate to be processed is left in the fastener 5c is checked by the substrate presence detecting sensor provided on the substrate transporting device RT1. After completion of the downward movement of the lifter, the lid on top of the processing tank is closed and processing of the substrates is carried out.

When the substrate transporting devices RT1 and RT2 deliver the substrates to the lifter, the substrate fastener 5c is moved upward, and when it reached the top dead center, it is moved along the transporting track 4, is stopped exactly above the processing tank, and then, is moved downward to the position immediately before the substrate delivery position of the lifter. However, the substrate processing apparatus according to the invention is constructed in such a manner that the substrate fastener 5c can be moved downward to the position immediately before the substrate delivery position of the lifter while the substrate transporting devices RT1 and RT2 are moving to the processing tank to which the substrates are delivered, and the lifter can be moved upward to the substrate delivery position while the substrate transporting devices RT1 and RT2 are moving. By overlapping the operation of the substrate transporting device and the lifter, the time period required for transporting the substrates may be reduced.

After completion of processing the substrates, the processing tank opens the lid on top thereof and moves the substrates upward to the substrate delivery position by the lifter. The substrate transporting device RT1 moves downward to the substrate delivery position in a state in which the extremities of the substrate fastener 5c is opened. Then, presence of the substrates on the lifter is checked. When there are substrates on the lifter, the substrates are fastened. Subsequently, the substrate transporting device RT1 moves the substrate fastener 5c upward. At this time, whether or not the substrates are properly fastened is checked by the substrate presence detecting sensor provided on the lifter and the substrate presence detecting sensor provided on the substrate transporting device RT1 before moved upward to the top dead center. The processing tank moves the lifter downward and closes the lid. Loading of the substrates to the processing tank, unloading of the substrates from the processing tank, and movement among the processing tanks of the substrate transporting devices RT2 and RT3 are the same as the substrate transporting device RT1.

The stocker, the unprocessed substrate loading unit, the shuttle, and the transporting path for the substrates in the substrate processing apparatus described above are shown in FIG. 9. As shown in FIG. 9, the unprocessed substrates stored in the cassette are loaded to the stocker 30, are transferred from the stocker 30 to the unprocessed substrate loading unit 35. Then all the substrates are fastened altogether and taken out from the cassette, are transferred to the shuttle 3 by the substrate hoisting unit 23, and are delivered to the shuttle 3. The shuttle 3 transfers the substrates to the substrate lowering unit 24, and delivers them to the substrate lowering unit 24. The substrate lowering unit 24 moves downward to the delivery position of the buffer 6 while holding the substrates and delivers the substrates to the buffer 6.

The substrate transporting device RT1 moving along the transporting track 4 fastens the substrates in the buffer 6 altogether, moves upward to the top dead center. After reaching the top dead center, the substrate transporting device RT1 moves to the position exactly above the first processing tank 10. After completion of movement, the substrate transporting device moves downward to the substrate delivery position of the processing tank and delivers the substrates to the lifter. Upon reception of the substrates, the lifter moves downward, and after completion of downward movement, processing is carried out in the processing tank. After completion of processing, the lifter moves upward to the substrate delivery position, and delivers the substrates to the substrate transporting device RT1 or RT2. In the same manner, the substrates are transported in sequence by the substrate transporting device RT1 or RT2 to the processing tank, where processing is carried out. The substrates having dried in the drying tank 20 are transferred to the processed substrate unloading unit 36 by the substrate transporting device RT3 and stored in the cassette by the processed substrate unloading unit 36. The substrates stored in the cassette are loaded into the stocker 30, and delivered to the next process by the stocker 30.

Subsequently, control of the substrate transporting device in the substrate processing apparatus 1 will be described. In the first place, processing conditions and transporting conditions in the substrate processing apparatus 1 are set. The processing conditions and the transporting conditions in the substrate processing apparatus include, for example, processing time assigned for each processing tank, the type of processing solution, transporting time of the substrate transporting device, and operating time of the lifter. After these processing conditions and transporting conditions are entered, processing operation including control of the substrate transporting device is scheduled by the scheduler (software) of the computer built-in the substrate processing apparatus 1. Timings of the operation of each substrate transporting device are determined according to the schedule. The computer built in the substrate processing apparatus 1 stores the substrate transportation sharing conditions which determines the sharing condition when transportation of the substrate occurs at the plurality of processing tanks simultaneously according the scheduling data prepared by the scheduler. The substrate transportation sharing conditions include such conditions that transportation of the substrates from the buffer 6 to the first processing tank 10 is carried out by the substrate transporting device RT1, transportation of the substrates from the drying tank 20 to the processed substrate unloading unit 36 is carried out by the substrate transporting device RT3, and in the case of simultaneous transportation of the substrates at the $n^{th}$ processing tank and the tanks before $n^{th}$ processing tank, transportation of the substrates in the $n^{th}$ processing tank is carried out by the substrate transporting device RT2, and transportation of the substrates in the tanks before the $n^{th}$ processing tanks is carried out by the substrate transporting device RT1.

Figure 10:
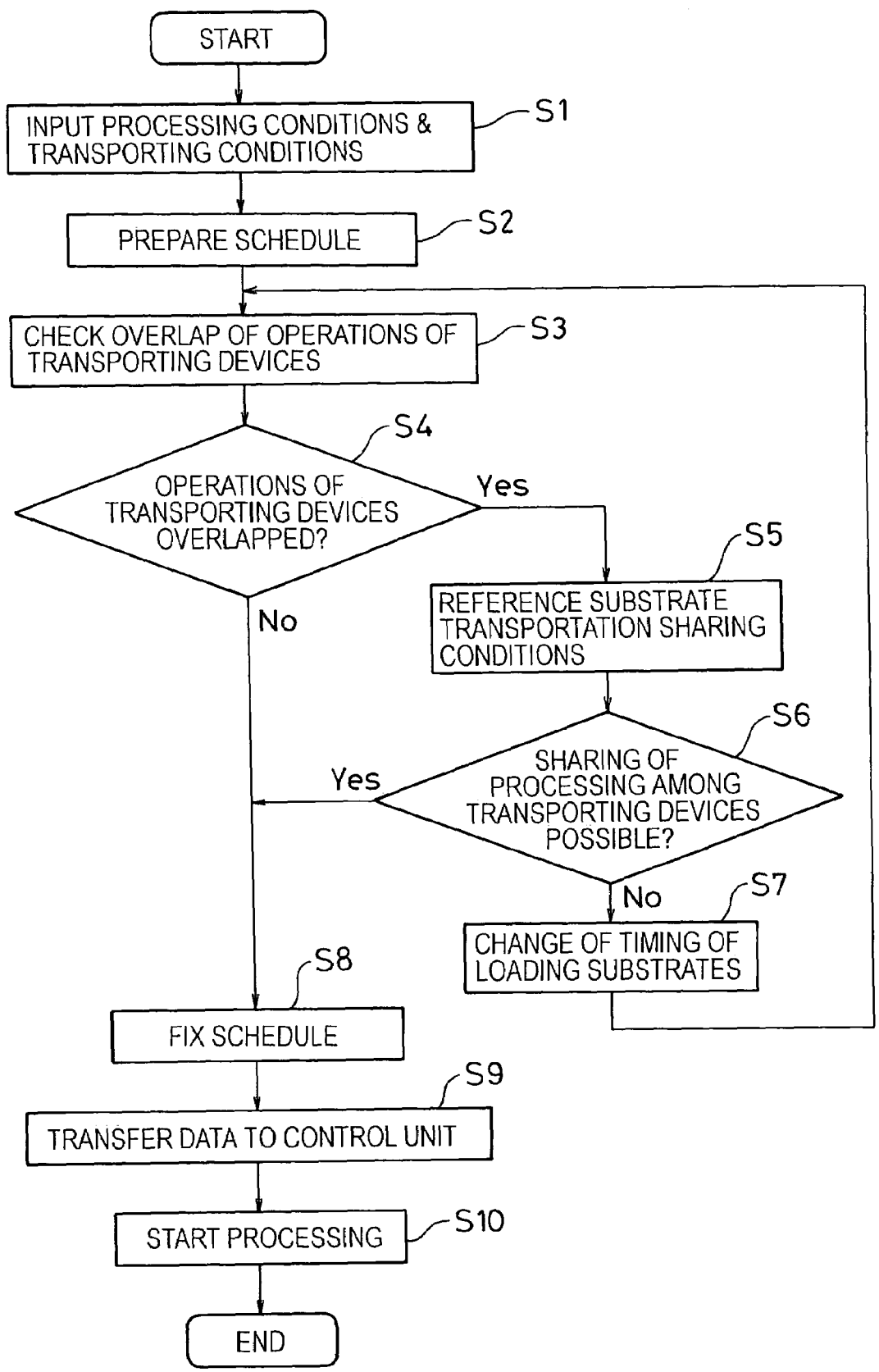
FIG. 10 is a flowchart for preparing a control sequence of the substrate processing apparatus by a scheduler.

FIG. 10 is a flowchart for preparing a control sequence for the substrate processing apparatus 1 by the scheduler. As shown in FIG. 10, in a first place, data on processing conditions and transporting conditions relating the number of processing tanks to be installed, the processing time assigned for each processing tank, the types of processing solutions, transporting time of the substrate transporting device, and the operating time of the lifter are entered via an input device such as a keyboard, or by measurement of the transporting time, and the operating time of the lifter (teaching) (Step S1). The computer prepares a schedule of processing based on the entered data (Step S2). During scheduling, times to start loading and unloading of the substrates into/from the respective tank are calculated based on data on processing time assigned for each processing tank and the types of processing solutions in the processing tanks. Whether or not washing of the fastener of the substrate transporting device is determined based on the type of the processing solution in the processing tank. Accordingly, time to start processing and time to terminate processing in every processing tank, and timing of loading and unloading of the substrates for each processing tank of the substrate transporting device are determined.

Subsequently, whether or not the operations of the substrate transporting devices are overlapped is determined from timing of loading and unloading of the substrate transporting device (Step S3). When the operations of the substrate transporting devices are not overlapped, the procedure goes to Step S8. When the operations of the substrate transporting device are overlapped, the procedure goes to Step S5 (Step S4), where the substrate transportation sharing conditions stored in the storage are referenced (Step S5), and whether or not transportation of the substrates may be well shared among the substrate transporting devices RT1, RT2, and RT3 is checked. When it maybe well shared, the procedure goes to Step S8. When it cannot be well shared, the procedure goes to Step S7 (Step S6), timing of loading the substrate prepared by the schedule is changed (Step S7), and the procedure goes to Step S3. When it is determined that the substrate transporting devices can manage, the schedule is fixed (Step S8). Data on the fixed schedule is transferred to the control unit of the substrate processing apparatus 1 (Step S9), and then the substrate processing apparatus 1 starts processing (Step S10). With the procedures described above, the substrates in the buffer 6 are transported to the first processing tank by the substrate transporting device RT1, where processing is started.

Figure 11:
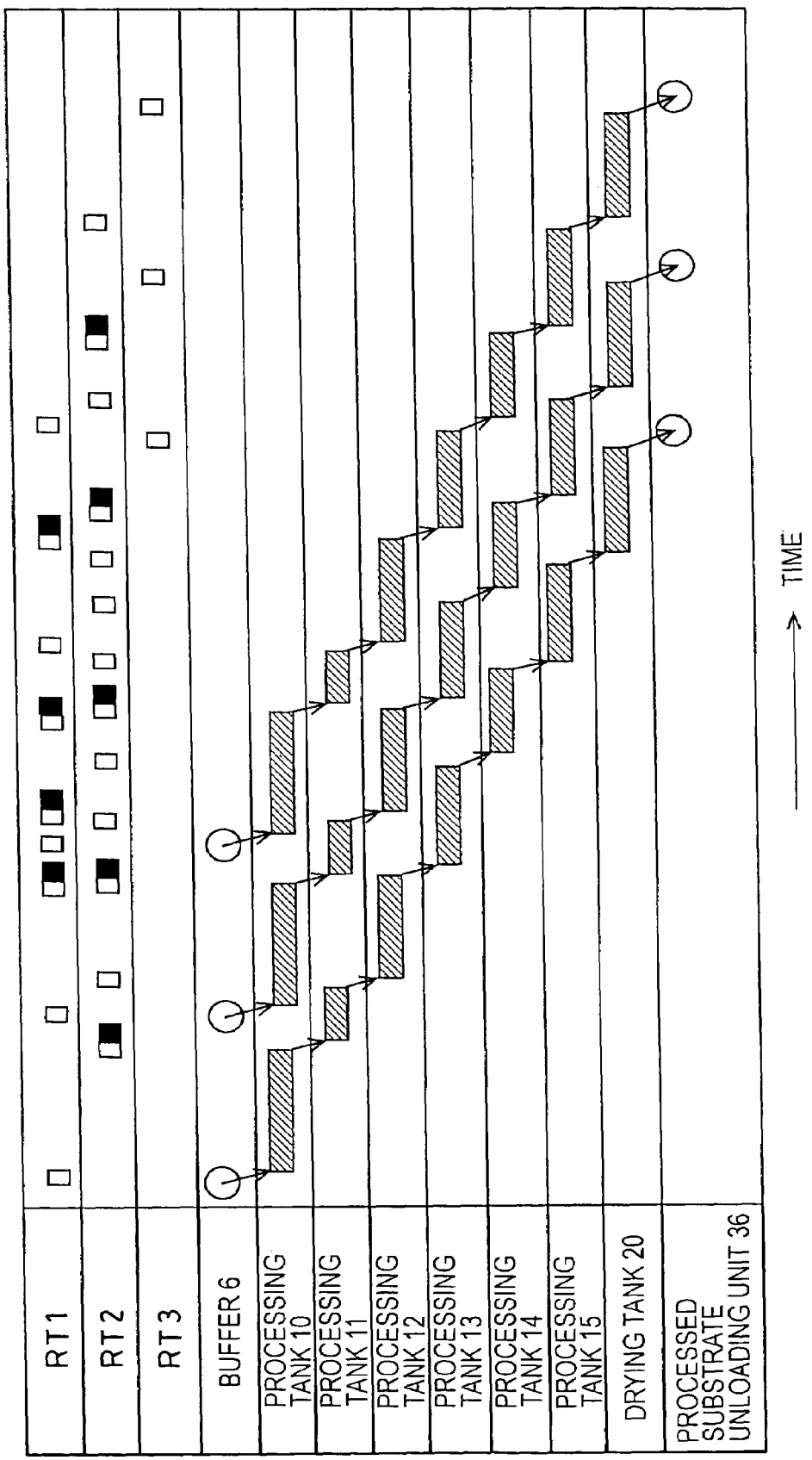
FIG. 11 is a timing chart showing processing of the substrate in each processing tank according to the control sequence for the substrate processing apparatus prepared by the scheduler.

Timing chart shown in FIG. 11 shows processing of the substrates in each processing tank according to the control sequence of the substrate processing apparatus 1 prepared by the scheduler in chronological order. Squares shown in the columns of the substrate transporting devices RT1, RT2, and RT3 show the substrate transporting operation, and black squares represent washing operation of the substrate fastener in the fastener washing tank. As shown in FIG. 11, when transportation of the substrates occurred simultaneously, transportation of the substrates may be carried out in sequence without delay by allowing the substrate transporting devices RT1, RT2, and RT3 to share the operation. In comparison with the case in which a single substrate transporting device is provided, it is not necessary to delay loading of the substrates into the washing tank, and thus improvement of the throughput is achieved. In addition, since the unprocessed substrates are transported by the shuttle and thus the substrate transporting devices must simply perform transportation among the processing tanks, improvement of the throughput may be achieved.

What is claimed is:

1. A substrate processing apparatus comprising:
a plurality of processing tanks for processing substrates, the plurality of processing tanks being arranged in line with each other in one line;
a transporting track provided along the line of processing tanks;
a plurality of substrate transporting devices for receiving, delivering and transporting the substrates, comprising a first substrate transporting device which is operable in a first operating range that extends at least from a first processing tank in the line of processing tanks to a last processing tank in the line of processing tanks, so as to include all of the processing tanks in the line, and a second substrate transporting device which is operable in a second operating range that extends at least from the first processing tank in the line of processing tanks to the last processing tank in the line of processing tanks, so as to include all of the processing tanks in the line, said first substrate transporting device and said second substrate transporting device being provided on the same transporting track, which extends along the line of processing tanks, such that when the second substrate transporting device is positioned at an $n^{th}$ one of the processing tanks the first substrate transporting device is movable only up to an $n-^{th}$ one of the processing tanks which immediately precedes the $n^{th}$ one of the processing tanks; and
a scheduler which prepares scheduling data for controlling operations of the plurality of substrate transporting devices, based on processing conditions and transporting conditions which are entered in advance;

wherein when the scheduling data indicates that transportation of the substrates occurs at more than one of the processing tanks simultaneously, the scheduler checks whether it is possible for the transportation of the substrates at said more than one of the processing tanks to be shared among the plurality of substrate transporting devices; and wherein when it is possible for the transportation of the substrates to be shared the scheduling data prepared by the scheduler is confirmed and the operations of the plurality of substrate transporting devices are controlled based on the scheduling data, and when it is not possible for the transportation of the substrates to be shared a timing of loading substrates before processing at the processing tanks is changed.

2. The substrate processing apparatus according to claim 1, wherein each said substrate transporting device comprises a laterally movable portion via which the substrate transporting device is moved along the transporting track, a vertically movable portion which is movable up and down in a vertical direction, and a substrate fastener, which is provided on the vertically movable portion, for holding the substrates.

3. The substrate processing apparatus according to claim 1, wherein each of the plurality of substrate transporting devices comprises a substrate fastener for holding the substrates, and the substrate processing apparatus further comprises at least one fastener washing tank for washing the substrate fastener of at least one of the substrate transporting devices.

4. The substrate processing apparatus according to claim 1, wherein each of the plurality of substrate transporting devices comprises a substrate fastener for holding the substrates, and the substrate processing apparatus further comprises a first fastener washing tank for washing the substrate fastener of at least the first substrate transporting device, and a second substrate fastener washing tank for washing the substrate fastener of at least the second substrate transporting device.

5. The substrate processing apparatus according to claim 4, wherein the first operating range includes the first fastener washing tank and not the second fastener washing tank, and the second operating range includes the second fastener washing tank and not the first fastener washing tank.

6. The substrate processing apparatus according to claim 1, further comprising a buffer which temporarily accommodates the substrates before the substrates are transferred to the processing tanks.

7. The substrate processing apparatus according to claim 6, wherein the first operating range includes the buffer and the first substrate transporting device is operable to transfer the substrates from the buffer to the first one of the processing tanks.

8. The substrate processing apparatus according to claim 7, wherein the second operating range does not include the buffer.

9. The substrate processing apparatus according to claim 1, further comprising a drying tank for drying the substrates after the substrates are processed in the processing tanks.

10. The substrate processing apparatus according to claim 9, further comprising a processed substrate unloading unit in which the substrates dried by the drying tank are stored.

11. The substrate processing apparatus according to claim 10, wherein the plurality of substrate transporting devices comprises a third substrate transporting device which is provided on the same transporting track as the first and second substrate transporting devices and which is operable in a third operating range that overlaps with the second operating range; and wherein the third operating range includes the drying tank and the processed substrate unloading unit, and the third substrate transporting device is operable to transfer substrates from the drying tank to the processed substrate unloading unit.

12. The substrate processing apparatus according to claim 11, wherein each of the plurality of substrate transporting devices comprises a substrate fastener for holding the substrates, and the substrate processing apparatus further comprises:

a first fastener washing tank for washing the substrate fastener of the first substrate transporting device; and a second substrate fastener washing tank for washing the substrate fastener of the second substrate transporting device and the substrate fastener of the third substrate transporting device.

13. the substrate processing apparatus according to claim 12, wherein the first operating range includes the first fastener washing tank and not the second fastener washing tank, the second operating range includes the second fastener washing tank and not the first fastener washing tank, and the third operating range includes the second fastener washing tank and not the first fastener washing tank.

14. The substrate processing apparatus according to claim 1, further comprising a shuttle for transporting unprocessed substrates which is provided above the substrate transporting devices and which is provided in parallel with the transporting track.

15. The substrate processing apparatus according to claim 14, further comprising a substrate lowering unit for receiving the unprocessed substrates from the shuttle and sending the unprocessed substrates to a delivery position for transport by the first substrate transporting device.

16. The substrate processing apparatus according to claim 14, further comprising a substrate hoisting unit for moving and transporting the unprocessed substrates upward to the shuttle.

17. The substrate processing apparatus according to claim 16, further comprising an unprocessed substrate loading unit for transporting the unprocessed substrates from a position for loading the unprocessed substrates to the substrate hoisting unit.

18. The substrate processing apparatus according to claim 1, wherein the substrates are processed along a processing route from the first one of the processing tanks to the last one of the processing tanks, and wherein the substrate processing apparatus further comprises:

a processed substrate unloading unit in which the substrates are stored after processing of the substrates is completed, and which is positioned at an end side of the processing route;

an unprocessed substrate loading unit into which unprocessed substrates are loaded, and which is positioned at the end side of the processing route so as to be closer to the last one of the processing tanks than to the first one of the processing tanks;

a buffer which temporarily accommodates the substrates before the substrates are transferred to the processing tanks, and which is positioned at a beginning side of the processing route; and a shuttle for transporting unprocessed substrates from the unprocessed substrate loading unit to the buffer, and which is provided above the substrate transporting devices and which is provided in parallel with the transporting track.

19. The substrate processing apparatus according to claim 18, further comprising:
a substrate hoisting unit which receives the unprocessed substrates from the unprocessed substrate loading unit and which moves and transports the unprocessed substrates upward to the shuttle; and
a substrate lowering unit which receives the unprocessed substrates from the shuttle and delivers the unprocessed substrates to the buffer.

20. The substrate processing apparatus according to claim 19, wherein the plurality of substrate transporting devices comprises a third substrate transporting device which is provided on the same transporting track as the first and second substrate transporting devices and which is operable in a third operating range that overlaps with the second operating range;
wherein each of the plurality of substrate transporting devices comprises a substrate fastener for holding the substrates;
wherein the substrate processing apparatus further comprises:
a first fastener washing tank for washing the substrate fastener of the first substrate transporting device;
second substrate fastener washing tank for washing the substrate fastener of the second substrate transporting device and the substrate fastener of the third substrate transporting device; and
a drying tank for drying the substrates after the substrates are processed in the processing tanks before the processed substrates are stored in the processed substrate unloading unit;
wherein the first operating range includes the plurality of processing tanks, the first substrate fastener washing unit, and the buffer;
wherein the second operating range includes the plurality of processing tanks and the second substrate fastener washing unit; and
wherein the third operating range includes the second substrate fastener washing unit, the drying tank, and the processed substrate unloading unit.

* * * * *